United States Patent
Götz et al.

(10) Patent No.: US 6,621,356 B2
(45) Date of Patent: Sep. 16, 2003

(54) PHASE-LOCKED LOOP WITH SHORT TRANSIENT RECOVERY DURATION AND SMALL INTERFERENCE SIGNAL COMPONENT

(75) Inventors: Edmund Götz, Dachau (DE); Bernd Memmler, Ottobrunn (DE); Günter Schönleber, Oestrich-Winkel (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/113,632

(22) Filed: Mar. 27, 2002

(65) Prior Publication Data

US 2002/0153959 A1 Oct. 24, 2002

Related U.S. Application Data

(63) Continuation of application No. PCT/DE00/01987, filed on Jun. 16, 2000.

(30) Foreign Application Priority Data

Sep. 27, 1999 (DE) .......................... 199 46 200

(51) Int. Cl.⁷ ................................. H03L 7/00
(52) U.S. Cl. ........................ 331/25; 331/16; 331/18; 331/1 A; 327/156; 327/159
(58) Field of Search ................. 331/DIG. 2, 17, 331/1 A, 18, 34, 25, 16; 327/156, 159

(56) References Cited

U.S. PATENT DOCUMENTS

| 5,276,408 A | 1/1994 | Norimatsu | 331/8 |
| 5,420,545 A | 5/1995 | Davis et al. | 331/17 |
| 5,694,089 A | 12/1997 | Adachi et al. | 331/16 |

FOREIGN PATENT DOCUMENTS

| DE | 39 39 709 A1 | 6/1991 |
| DE | 197 48 885 A1 | 5/1999 |
| EP | 0 641 082 A2 | 3/1995 |
| JP | 57 020 037 A | 2/1982 |
| JP | 05-206848 | * 8/1993 |

OTHER PUBLICATIONS

Blaesner, W.: "Schneller und rauscharmer Frequenzsynthesizer in Fraktional–N–Technik" [Fast and Low–noise Frequent Synthesizer in Fractional–N–Technique], Elektonik Informationen, No. 3, 1999, pp. 64–66.

* cited by examiner

*Primary Examiner*—Arnold Kinkead
(74) *Attorney, Agent, or Firm*—Laurence A. Greenberg; Werner H. Stemer; Ralph E. Locher

(57) ABSTRACT

In order to shorten the transient recovery duration, the phase-locked loop has a voltage-controlled oscillator providing an oscillator signal to a first frequency divider. The first frequency divider divides the frequency of the oscillator signal, generates a first divider output signal therefrom, and passes it to a phase comparator during the transient recovery duration of the phase-locked loop. Furthermore, a unit is provided, which, after the transient recovery duration of the phase-looped loop, divides the frequency of the first divider output signal and passes it to the phase comparator. The phase comparator compares the first divider output signal with a first reference signal during the transient recovery duration. The phase comparator compares the divided divider output signal with a second reference signal after the transient recovery duration. The output of the phase comparator is connected to the voltage-controlled oscillator via a controllable charge pump.

15 Claims, 2 Drawing Sheets

PHASE-LOCKED LOOP WITH SHORT TRANSIENT RECOVERY DURATION AND SMALL INTERFERENCE SIGNAL COMPONENT

CROSS-REFERENCE TO RELATED APPLICATION

This application is a continuation of copending International Application No. PCT/DE00/01987, filed Jun. 16, 2000, which designated the United States.

BACKGROUND OF THE INVENTION

Field of the Invention:

The invention relates to a phase-locked loop which can be used in mobile radio, for example.

The phase-locked loop, also designated as PLL hereinafter, can be used in particular in TDMA mobile radio systems (Time Division Multiple Access) such as, for example, GSM (Global System for Mobile Communication) in multislot operation. Time division multiple access is a method for organized access to a communication medium. The basic idea is to split the available bandwidth uniformly between the individual subscribers. There is a time frame which, in the case of a plurality of subscribers, is subdivided into time slots of equal size, and each subscriber is assigned a time slot. This demands transient recovery times that are shorter than 250 μs. With a customary integer-N phase-locked loop, however, such a short transient recovery time can barely be achieved.

U.S. patent application Ser. No. 5,694,089 discloses a PLL frequency synthesizer. The synthesizer has a reference divider for dividing the reference signal. Furthermore, it has an RF signal divider that divides the output signal of a voltage-controlled oscillator. If the frequency is changed, first the divider value of the RF signal divider changes periodically by, on average, a fractional divider value. If the frequency has approximately changed over, the RF signal divider is brought into the operating mode of a conventional integer-N divider. For this purpose, the frequency can rapidly be changed over into the fractional operating mode. Consequently —depending on the operating mode—the RF signal divider is loaded with different divider values. However, this has the disadvantage that the transient recovery process is slowed down by virtue of the fact that new divider values have to be loaded into the RF signal divider.

SUMMARY OF THE INVENTION

It is accordingly an object of the invention to provide a phase-locked loop which overcomes the above-mentioned disadvantages of the prior art apparatus of this general type.

In particular, it is an object of the invention to provide a phase-locked loop in which the transient recovery duration is very short and the interference signal component is small.

With the foregoing and other objects in view there is provided, in accordance with the invention, a phase-locked loop that includes: a voltage-controlled oscillator for generating an oscillator signal having a frequency; a controllable charge pump having an output connected to the voltage-controlled oscillator; a phase comparator; a first frequency divider which, during a transient recovery duration, generates a first divider output signal by dividing the frequency of the oscillator signal and provides the first divider output signal to the phase comparator; and a unit which, after the transient recovery duration, divides the frequency of the first divider output signal to obtain a divided first divider output signal and provides the divided first divider output signal to the phase comparator. The phase comparator compares the first divider output signal with a first reference signal during the transient recovery duration. The phase comparator compares the divided first divider output signal with a second reference signal after the transient recovery duration. The phase comparator has an output connected to the controllable charge pump.

In accordance with an added feature of the invention, the unit includes a second frequency divider and a first multiplexer with a first input, a second input, and an output. The first frequency divider has an output connected to the first input of the first multiplexer, and the second frequency divider has an output connected to the second input of the first multiplexer.

In accordance with an additional feature of the invention, the phase-locked loop includes: a third frequency divider that receives a reference oscillator signal from a reference oscillator and generates the first reference signal from the reference oscillator signal; and a fourth frequency divider that receives the reference oscillator signal from the reference oscillator and generates the second reference signal from the reference oscillator signal.

In accordance with another feature of the invention, the phase-locked loop includes a second multiplexer that selectively passes either the first reference signal or the second reference signal to the phase comparator.

In accordance with a further feature of the invention, the phase-locked loop includes: a second multiplexer that has a first input and a second input; a third frequency divider that is connected to the first input of the second multiplexer; and a fourth frequency divider that connects the third frequency divider to the second input of the second multiplexer.

In accordance with a further added feature of the invention, the phase-locked loop includes a filter that is connected between the controllable charge pump and the voltage-controlled oscillator.

In accordance with a further additional feature of the invention, the filter is a low-pass filter.

In accordance with yet an added feature of the invention, the unit includes a multiplexer that is controlled by a control device.

In accordance with yet an additional feature of the invention, the phase-locked loop includes a filter that is connected between the controllable charge pump and the voltage-controlled oscillator. The charge pump and the filter have parameters that are prescribed by the control device.

In accordance with yet another feature of the invention, the unit has a first gating circuit for gating the first divider output signal from the first frequency divider; and the unit has a gating logic control circuit for controlling the first gating circuit.

In accordance with yet a further feature of the invention, the gating circuit is an AND gate that has a first input and a second input; the first frequency divider has an output connected to the first input of the AND gate; the gating logic control circuit has an output connected to the second input of the AND gate; and the AND gate has an output connected to the phase comparator.

In accordance with yet a further added feature of the invention, the phase-locked loop includes a second gating circuit for gating a reference signal. The gating logic control circuit controls the second gating circuit.

In accordance with yet a further additional feature of the invention, the phase-locked loop includes a control device that, together with the reference signal, controls the gating logic control circuit.

In accordance with yet another added feature of the invention, the phase-locked loop includes an accumulator for holding a value. The first frequency divider is connected to the accumulator. The first frequency divider depending on the value held in the accumulator, divides the frequency of the oscillator signal by either a first value or a second value.

In other words, the phase-locked loop has a voltage-controlled oscillator, which generates an oscillator signal. Furthermore, a first frequency divider is provided, which divides the frequency of the oscillator signal, generates a first divider output signal therefrom and passes it to a phase comparator during the transient recovery duration of the phase-locked loop. A unit is additionally provided, which, after the transient recovery duration of the phase-locked loop, divides the frequency of the first divider output signal and passes this second divider output signal to the phase comparator. The phase comparator compares the first divider output signal with a first reference signal during the transient recovery duration of the phase-locked loop and compares the second divider output signal with a second reference signal after the transient recovery duration of the phase-locked loop. The output of the phase comparator is connected to a controllable charge pump. The output of the controllable charge pump is connected to the voltage-controlled oscillator.

In an advantageous embodiment of the invention, the unit of the phase-locked loop has a second divider and a first multiplexer with two inputs and an output. The output of the first divider is connected to the first input of the first multiplexer and the output of the second divider is connected to the second input of the multiplexer.

In a further advantageous embodiment, a third and a fourth frequency divider are provided, which generate the first and second reference signals from a reference oscillator signal that originates from a reference oscillator.

A second multiplexer may advantageously be provided, which passes the first or the second reference signal to the phase comparator.

In a further advantageous refinement of the invention, the third frequency divider is connected to the first input of the second multiplexer and the fourth frequency divider is connected to the second input of the second multiplexer.

A filter is advantageously connected between the charge pump and the voltage-controlled oscillator. This makes it possible to suppress interfering signal components. This filter may be a low-pass filter.

A control unit is advantageously provided, which controls the multiplexers. The control unit may additional prescribe parameters for the charge pump and the filter.

In a further refinement of the invention, the unit of the phase-locked loop has a first gating circuit for gating the signal originating from the first frequency divider and has a gating logic control circuit. The gating logic control circuit controls the first gating circuit.

The gating circuit may be an AND gate having a first input that is connected to the output of the first frequency divider and having a second input that is connected to the output of the blanking logic. The output of the gating circuit is connected to the phase comparator.

A second gating circuit may be provided for gating the reference signal. In this case, the blanking logic controls the second gating circuit. The control unit and the reference signal may together control the blanking logic.

Finally, the first frequency divider can be connected to an accumulator, and depending on the value held in the accumulator, the first frequency divider will divide the frequency by a first or a second value.

Other features which are considered as characteristic for the invention are set forth in the appended claims.

Although the invention is illustrated and described herein as embodied in a phase-locked loop, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
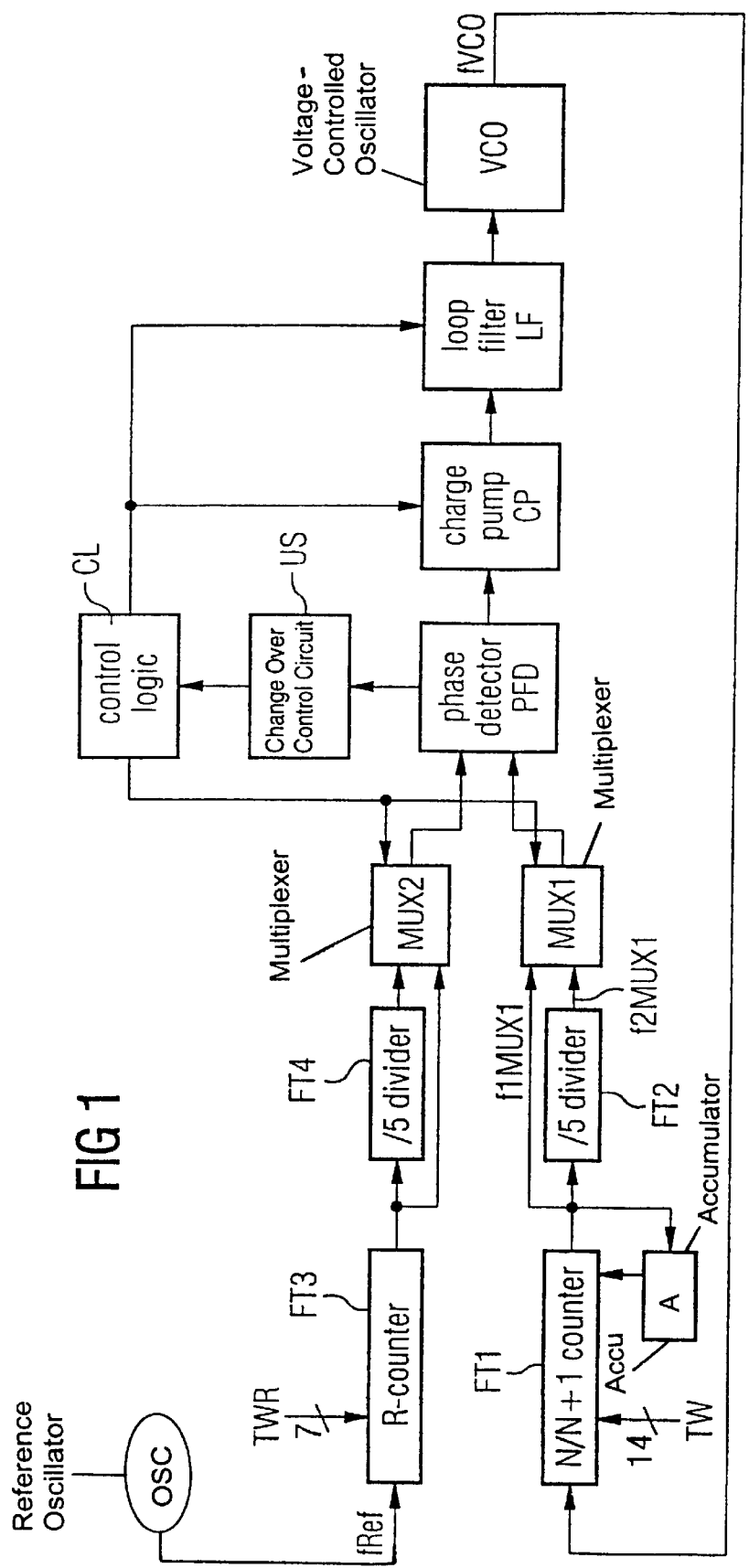
FIG. 1 shows a first embodiment of a phase-locked loop.

Referring now to the figures of the drawing in detail and first, particularly, to FIG. 1 thereof, there is shown a first embodiment of a phase-locked loop. The phase-locked loop has a voltage-controlled oscillator VCO, which generates an oscillator signal having the frequency fVCO. This oscillator signal is fed to a first frequency divider FT1, which divides the frequency fVCO by the divider value TW. As in the exemplary embodiment shown in FIG. 1, the divider value TW is loaded into the first frequency divider FT1 via a line having a width of 14 bits. The divider value TW is generally loaded into the first frequency divider FT1 during the initialization of the phase-locked loop and then persists independently of the operating state of the phase-locked loop, that is to say, also after the transient recovery duration of the phase-locked loop. The first frequency divider FT1 is loaded with a corresponding new divider value TW only when the phase-locked loop is going to lock on at a new frequency. The first frequency divider FT1 is connected to an accumulator accu, in which an accumulator value A is stored. In the present exemplary embodiment, the first frequency divider FT1 is an N/N+1 counter that counts either up to N or up to N+1 depending on the accumulator value A stored in the accumulator accu.

As soon as the N/N+1 counter reaches the value N or the value N+1, a signal is present at the output of the N/N+1 counter, which signal is also passed, inter alia, to the input of the accumulator accu. The signal present at the output of the N/N+1 counter is a digital signal. As soon as the number of level changes of the digital signal corresponds to the accumulator value A stored in the accumulator accu, the accumulator accu supplies a control signal to the N/N+1 counter, which then counts up to N+1 if it counted up to N beforehand, and then counts up to N if it counted up to N+1 beforehand.

The output signal of the first frequency divider FT1 is fed directly to the input of a first multiplexer MUX1, and via a second frequency divider FT2, to the second input of the multiplexer MUX1. Consequently, a signal having the frequency:

$$f1MUX1 = \frac{fVCO}{N} \text{ or } \frac{fVCO}{N+1}$$

is present at the first input of the first multiplexer MUX1. A signal having the frequency:

$$f2MUX1 = \frac{fVCO}{N \cdot TW2} \text{ or } \frac{fVCO}{(N+1) \cdot TW2}$$

is then present at the second input of the first multiplexer MUX1, where TW2 is the divider value that is loaded in the second frequency divider FT2.

In the exemplary embodiment shown in FIG. 1, the divider value TW2 =5. The output of the first multiplexer MUX1 leads to a phase detector PFD, which is also designated as a phase comparator hereinafter.

A third frequency divider FT3 receives a reference oscillator signal having a reference frequency fRef from a reference oscillator OSC. The third frequency divider FT3 divides the reference oscillator signal by the divider value TWR. The divider value TWR is fed to the third frequency divider FT3 through a line having a width of 7 bits. In the present exemplary embodiment, the third frequency divider FT3 is realized by a counter that counts up to the divider value TWR. The reference oscillator signal divided by the divider value TWR and having the frequency $$f1MUX2 = \frac{fRef}{TWR}$$

is then present at the output of the third frequency divider FT3, and this signal is passed to the first input of a second multiplexer MUX. This frequency-divided signal is additionally divided using a fourth frequency divider FT4 and is passed to the second input of the second multiplexer MUX2. In the present exemplary embodiment, the fourth frequency divider FT4 is realized by a divider with the divider value =5. The output of the second multiplexer MUX2 is connected to the second input of the phase detector PFD.

A control logic unit CL controls the two multiplexers MUX1 and MUX2, so that, during the transient recovery phase of the phase-locked loop, the reference oscillator signal divided by the divider value TWR and having the frequency:

$$f1MUX2 = \frac{fRef}{TWR}$$

is compared with the oscillator signal divided by the divider value TW and having the frequency:

$$f1MUX1 = \frac{fVCO}{N} \text{ or } f1MUX1 = \frac{fVCO}{N+1}.$$

If there is no longer a phase difference between the two signals or if the phase difference lies below a predetermined value, a corresponding output signal at the phase detector PFD informs the control logic unit CL, via a changeover control circuit US, that the settled state has been reached and that the phase-locked loop will now be operated at the lower frequencies:

$$f2MUX2 = \frac{fRef}{TW \cdot 5} \text{ and } f2MUX1 = \frac{fVCO}{TW \cdot 5}.$$

In other words, the phase comparator PFD now compares these lower frequencies with one another. The control difference between the two frequencies present at the inputs of the phase detector PFD serves for controlling a charge pump CP, which generates an output current that drives the voltage-controlled oscillator VCO via a loop filter LF.

Control lines connect the output of the control logic unit CL to the charge pump CP and to the loop filter LF. Using the control lines, the control logic unit CL may additionally supply parameters for the charge pump CP and for the loop filter LF.

By virtue of the fact that high frequencies are compared with one another in the transient recovery state of the phase-locked loop, the control loop can settle more quickly. However, in order to avoid side lines in the spectrum of the oscillator signal (spurious), after the transient recovery, recourse is made to the comparison of frequencies that are additionally divided by the second frequency divider FT2 or the fourth frequency divider FT4, respectively. This makes it possible to avoid interference in the settled state. The changeover operation is controlled by the control logic unit CL, which transmits the corresponding control signals to the two multiplexers MUX1 and MUX2.

The inventive phase-locked loop operates in the fractional-N mode during the transient recovery process and in the integer-N mode in the settled state.

In order to optimize the filter parameters of the loop filter LF and the charge pump parameters of the charge pump CP, the control logic unit CL can transmit corresponding control signals to the charge pump CP and the loop filter LF. Thus, by way of example, a different limiting frequency may be necessary for the loop filter LF during the transient recovery process than in the settled state.

The third frequency divider FT3 may be a down-counter, for example. The same applies to the first frequency divider FT1.

The divider values of the four frequency dividers FT1, FT2, FT3 and FT4 are set such that, in each case, approximately identical frequencies can be compared with one another at the inputs of the phase detector PFD.

The divider cycle of the first frequency divider FT1, which specifies how often division by N is effected and how often division by N+1 is effected, is repeated depending on the accumulator value A. Since, in principle, the first frequency divider FT1 can only divide by an integer divider value TW, a changeover is made periodically between the divider values and N and N+1 by the accumulator accu, so that over a specific period of time, on average, division by a divider value lying between N and N+1 is effected, which corresponds to a fractional divider ratio. The value N is defined by the divider value TW.

The PLL operates at a frequency prescribed by the frequency dividers FT1, FT2, FT3 and FT4.

If a new frequency is set by changing the divider values TW and TWR and loading them into the first frequency divider FT1 and the third frequency divider FT3, respectively, a transient recovery process follows within which relatively large phase errors arise. These phase errors are detected in the changeover control circuit US and forwarded to the control logic unit CL. The control logic unit CL then switches the two multiplexers MUX1 and MUX2 in such a way that the two higher-frequency divided signals, which were thus not additionally divided by the second frequency divider FT2 and the fourth frequency divider FT4, respectively, are passed to the phase detector PFD. Consequently, the comparison frequency at the phase detector PFD is increased by the divider value loaded in the two frequency dividers FT2 and FT4, respectively, by the factor 5 in the present exemplary embodiment. Thus, five times more phase comparisons are carried out per unit time. The transient recovery can be accelerated by this measure. In addition, in this operating mode, the current for the charge pump CP and the loop filter LF can be correspondingly set by the control logic unit CL. These measures can be used to ensure fast transient recovery to the new desired frequency with a stable phase control.

In order to avoid the sudden phase changes that occur in this operating mode, caused by the changeover between the values N and N+1, which is associated with interference, the comparison frequency is reduced by the factor 5 after the transient recovery. The factor by which the comparison frequency is reduced depends on external boundary conditions and is coordinated with the respective requirements.

If the phase-locked loop has settled to the new desired value of the frequency, this is communicated from the phase detector PFD to the changeover control circuit US and hence to the control logic unit CL. If the phase error lies below a set value, then the two multiplexers MUX1 and MUX2 are changed over and the signals of the first frequency divider FT1 and of the third frequency divider FT3 are divided by 5 again, the current of the charge pump CP is reset again, and the loop filter LF is changed over again.

Figure 2:
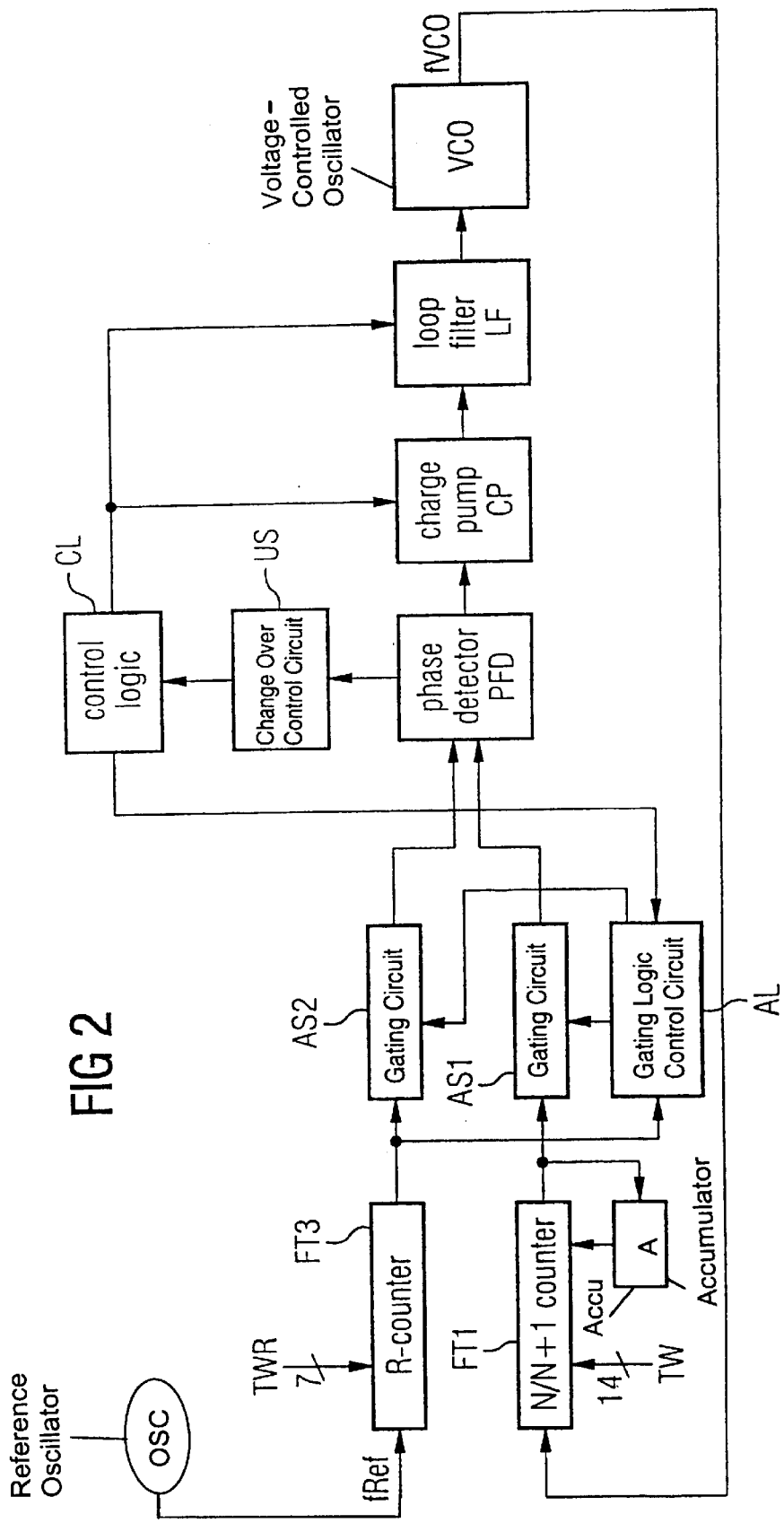
FIG. 2 shows a second embodiment of the phase-locked loop.

FIG. 2 shows a second embodiment of the inventive phase-locked loop. The components phase detector PFD, changeover control circuit US, control logic unit CL, charge pump CP, loop filter LF and voltage-controlled oscillator VCO correspond to the components shown in FIG. 1. The first frequency divider FT1, the third frequency divider FT3 and the accumulator accu shown in FIG. 2 also correspond to the frequency dividers FT1 and FT3 and the accumulator accu shown in FIG. 1.

In FIG. 2, the output of the first frequency divider FT1 is connected both to the accumulator accu and to a first blanking or gating circuit AS1. The first gating circuit AS1 is controlled by a blanking logic circuit AL, which is in turn driven by the control logic unit CL in conjunction with the third frequency divider FT3. The third frequency divider FT3 is connected to the input of a second gating circuit AS2. The output of the second gating circuit AS2 is connected to the phase detector PFD. The two gating circuits AS1 and AS2 may be AND gates, for example. The blanking or gating logic control circuit AL in conjunction with the two gating circuits AS1 and AS2 control which signal components of the output signal of the first frequency divider FT1 or which signal components of the third frequency divider FT3 respectively pass to the phase detector PFD. Through the targeted suppression of specific signal components of the output signals of the first frequency divider FT1 or of the third frequency divider FT3, respectively, signals with reduced frequency can be fed to the phase detector PFD.

The gating circuits AS1 and AS2 are gate circuits connected between the outputs of the dividers FT1 and FT3, respectively, and the phase detector inputs. Only every nth pulse is thus conducted to the phase detector PFD. Thus, in the case of a fractional mode of 5, such as in GSM, only every fifth pulse is fed to the phase detector PFD. In principle, the gating circuits AS1 and AS2 operate in the same way as the two frequency dividers FT2 and FT4 and the two multiplexers MUX1 and MUX2 shown in FIG. 1. The the two gating circuits AS1 and AS2 are controlled by a divider that opens the two gating circuits AS1 and AS2 at specific instants for one or more pulses. The two gating circuits AS1 and AS2 are not active in the fractional-n mode. Each counting pulse from the first frequency divider FT1 and the third frequency divider FT3 is conducted to the phase detector PFD. After a changeover has been made to the integer-n mode, the first and second gating circuits AS1 and AS2 are activated and only every nth pulse (n=2 ... 16 or else higher) is switched to the phase detector PFD. The divider ratios of the first frequency divider FT1 and third frequency divider FT3 are thus increased by the factor n.

It is advantageous that, besides the first frequency divider FT1 and the third frequency divider FT3, the embodiment shown in FIG. 2 only requires one further divider. This divider is part of the blanking or gating logic control circuit AL. In particular solutions of the fractional-n mode, a modulus counter that is already present can be used for this purpose.

We claim:

1. A phase-locked loop, comprising:
   a voltage-controlled oscillator for generating an oscillator signal having a frequency;
   a controllable charge pump having an output connected to said voltage-controlled oscillator;
   a phase comparator having an output connected to said controllable charge pump;
   a first frequency divider which, during a transient recovery duration, generates a first divider output signal by dividing the frequency of the oscillator signal and provides the first divider output signal to said phase comparator, the first divider output signal having a frequency;
   a unit which, after the transient recovery duration, divides the frequency of the first divider output signal to obtain a divided first divider output signal and provides the divided first divider output signal to said phase comparator; and
   an accumulator for holding a value, said first frequency divider connected to said accumulator;
   said first frequency divider depending on the value held in said accumulator, dividing the frequency of the oscillator signal by a value selected from the group consisting of a first value and a second value;
   said phase comparator comparing the first divider output signal with a first reference signal during the transient recovery duration; and
   said phase comparator comparing the divided first divider output signal with a second reference signal after the transient recovery duration.

2. The phase-locked loop according to claim 1, wherein:
   said unit includes a second frequency divider and a first multiplexer with a first input, a second input, and an output;
   said first frequency divider has an output connected to said first input of said first multiplexer; and
   said second frequency divider has an output connected to said second input of said first multiplexer.

3. The phase-locked loop according to claim 2, comprising:
   a third frequency divider for receiving a reference oscillator signal from a reference oscillator and for generating the first reference signal from the reference oscillator signal; and
   a fourth frequency divider for receiving the reference oscillator signal from the reference oscillator and for generating the second reference signal from the reference oscillator signal.

4. The phase-locked loop according to claim 2, comprising: a second multiplexer that selectively passes a reference signal selected from the group consisting of the first reference signal and the second reference signal to said phase comparator.

5. The phase-locked loop according to claim 2, comprising:
- a second multiplexer having a first input and a second input;
- a third frequency divider connected to said first input of said second multiplexer; and
- a fourth frequency divider connecting said third frequency divider to said second input of said second multiplexer.

6. The phase-locked loop according to claim 1, comprising: a filter connected between said controllable charge pump and said voltage-controlled oscillator.

7. The phase-locked loop according to claim 6, wherein said filter is a low-pass filter.

8. The phase-locked loop according to claim 1, comprising:
- a control device;
- said unit including a multiplexer that is controlled by said control device.

9. The phase-locked loop according to claim 8, comprising:
- a filter connected between said controllable charge pump and said voltage-controlled oscillator;
- said charge pump and said filter having parameters that are prescribed by said control device.

10. The phase-locked loop according to claim 1, wherein:
- said unit has a first gating circuit for gating the first divider output signal from said first frequency divider; and
- said unit has a gating logic control circuit for controlling said first gating circuit.

11. The phase-locked loop according to claim 10, wherein:
- said first gating circuit is an AND gate that has a first input and a second input;
- said first frequency divider has an output connected to said first input of said AND gate;
- said gating logic control circuit has an output connected to said second input of said AND gate; and
- said AND gate has an output connected to said phase comparator.

12. The phase-locked loop according to claim 11, comprising:
- a second gating circuit for gating a reference signal;
- said gating logic control circuit controlling said second gating circuit.

13. The phase-locked loop according to claim 10, comprising:
- a second gating circuit for gating a reference signal;
- said gating logic control circuit controlling said second gating circuit.

14. The phase-locked loop according to claim 13, comprising:
- a control device that, together with the reference signal, controls said gating logic control circuit.

15. The phase-locked loop according to claim 1, wherein the phase-locked loop operates in a fractional-N mode during the transient recovery duration and in an integer-N mode in a settled state.

* * * * *